US00RE49929E

(19) United States
(12) Reissued Patent
Kaimori et al.

(10) Patent Number: US RE49,929 E
(45) Date of Reissued Patent: Apr. 16, 2024

(54) SUBSTRATE FOR HIGH-FREQUENCY PRINTED WIRING BOARD

(71) Applicants: Sumitomo Electric Industries, Ltd., Osaka (JP); SUMITOMO ELECTRIC PRINTED CIRCUITS, INC., Koka (JP)

(72) Inventors: Shingo Kaimori, Osaka (JP); Masaaki Yamauchi, Osaka (JP); Kentaro Okamoto, Osaka (JP); Satoshi Kiya, Koka (JP); Kazuo Murata, Koka (JP)

(73) Assignees: Sumitomo Electric Industries, Ltd., Osaka (JP); SUMITOMO ELECTRIC PRINTED CIRCUITS, INC., Koka (JP)

(21) Appl. No.: 17/528,405

(22) Filed: Nov. 17, 2021

Related U.S. Patent Documents

Reissue of:
(64) Patent No.: 10,485,102
Issued: Nov. 19, 2019
Appl. No.: 16/336,211
PCT Filed: Jun. 20, 2018
PCT No.: PCT/JP2018/023409
§ 371 (c)(1),
(2) Date: Mar. 25, 2019
PCT Pub. No.: WO2019/031071
PCT Pub. Date: Feb. 14, 2019

(30) Foreign Application Priority Data

Aug. 8, 2017 (JP) ..... 2017-153721

(51) Int. Cl.
*H05K 1/03* (2006.01)
*B32B 15/08* (2006.01)
(Continued)

(52) U.S. Cl.
CPC ..... *H05K 1/0373* (2013.01); *B32B 15/08* (2013.01); *B32B 15/082* (2013.01); *B32B 15/20* (2013.01);
(Continued)

(58) Field of Classification Search
None
See application file for complete search history.

(56) References Cited

U.S. PATENT DOCUMENTS 4,849,284 A * 7/1989 Arthur ..... C08K 9/06 428/405
4,886,699 A 12/1989 Carroll et al.
(Continued)

FOREIGN PATENT DOCUMENTS

JP S61-102243 A 5/1986
JP H05-167211 A 7/1993
(Continued)

OTHER PUBLICATIONS

Asahi Glass Co. Ltd., "Product Safety Data Sheet", revised on Jan. 7, 2004, including English-language translation of relevant portion.

*Primary Examiner* — Sean E Vincent
(74) *Attorney, Agent, or Firm* — Faegre Drinker Biddle & Reath LLP

(57) ABSTRACT

A first embodiment of a substrate for a high-frequency printed wiring board according to the present disclosure is directed to a substrate for a high-frequency printed wiring board, the substrate including: a dielectric layer including a fluororesin and an inorganic filler; and a copper foil layered on at least one surface of the dielectric layer, wherein a surface of the copper foil at the dielectric layer side has a maximum height roughness (Rz) of less than or equal to 2 μm, and a ratio of the number of inorganic atoms of the inorganic filler to the number of fluorine atoms of the fluororesin in a superficial region of the dielectric layer at the copper foil side is less than or equal to 0.08.

8 Claims, 4 Drawing Sheets

(51) Int. Cl.

| | |
|---|---|
| ***B32B 15/082*** | (2006.01) |
| ***B32B 15/20*** | (2006.01) |
| ***B32B 27/20*** | (2006.01) |
| ***B32B 27/30*** | (2006.01) |
| ***H05K 1/02*** | (2006.01) |
| ***H05K 1/09*** | (2006.01) |
| ***H05K 3/00*** | (2006.01) |
| ***H05K 3/38*** | (2006.01) |

(52) U.S. Cl.

CPC ..... *B32B 27/20* (2013.01); *B32B 27/30* (2013.01); *H05K 1/0271* (2013.01); *H05K 1/03* (2013.01); *H05K 1/034* (2013.01); *H05K 1/09* (2013.01); *H05K 3/0055* (2013.01); *H05K 3/381* (2013.01); *H05K 2201/015* (2013.01); *H05K 2201/0209* (2013.01); *H05K 2201/0269* (2013.01); *H05K 2201/029* (2013.01); *H05K 2201/0355* (2013.01); *H05K 2201/068* (2013.01); *H05K 2203/1194* (2013.01)

(56) References Cited

U.S. PATENT DOCUMENTS

| | | | | |
|---|---|---|---|---|
| 5,358,775 | A | 10/1994 | Horn, III | |
| RE36,396 | E | 11/1999 | Arthur et al. | |
| 7,138,174 | B2 * | 11/2006 | Takeuchi | H05K 1/0353 428/221 |
| 2002/0038725 | A1 * | 4/2002 | Suzuki | H05K 1/0373 174/262 |
| 2004/0154930 | A1 | 8/2004 | Shinozaki | |
| 2007/0246255 | A1 | 10/2007 | Iwasa et al. | |
| 2010/0000771 | A1 | 1/2010 | Shimauchi et al. | |
| 2013/0108861 | A1 | 5/2013 | Yokota et al. | |
| 2013/0199828 | A1 | 8/2013 | Nakabayashi et al. | |
| 2014/0251656 | A1 | 9/2014 | Ikeda | |
| 2015/0079343 | A1 | 3/2015 | Nakabayashi et al. | |
| 2015/0307685 | A1 | 10/2015 | Pham | |
| 2015/0369467 | A1 * | 12/2015 | Saito | H05K 3/305 362/345 |
| 2016/0107376 | A1 * | 4/2016 | Nakajima | B29C 66/712 428/216 |
| 2016/0113109 | A1 * | 4/2016 | Kouchi | H05K 1/036 428/141 |
| 2016/0250830 | A1 * | 9/2016 | Kiya | B23B 27/30 174/258 |
| 2017/0208680 | A1 | 7/2017 | Fukuchi | |
| 2017/0208686 | A1 | 7/2017 | Fukuchi | |
| 2017/0210854 | A1 | 7/2017 | Matsuyama et al. | |
| 2017/0231088 | A1 | 8/2017 | Akatuka et al. | |
| 2018/0050516 | A1 | 2/2018 | Hosoda et al. | |

FOREIGN PATENT DOCUMENTS

| | | | |
|---|---|---|---|
| JP | 2001-176329 | A | 6/2001 |
| JP | 2004-244656 | A | 9/2004 |
| JP | 2006-179537 | A | 7/2006 |
| JP | 2007-314720 | A | 12/2007 |
| JP | 4938910 | B1 | 5/2012 |
| JP | 5235211 | B2 | 7/2013 |
| JP | 2013-201344 | A | 10/2013 |
| JP | 2014-127644 | A | 7/2014 |
| JP | 2014-175485 | A | 9/2014 |
| JP | 2016-046433 | A | 4/2016 |
| JP | 2017-119865 | A | 7/2017 |
| JP | 2017-128804 | A | 7/2017 |
| JP | 2017-130658 | A | 7/2017 |
| JP | 2017-132898 | A | 8/2017 |
| JP | 2018-014387 | A | 1/2018 |
| WO | WO 2012/161162 | A1 | 11/2012 |
| WO | WO 2014/192718 | A1 | 12/2014 |
| WO | WO 2015/182696 | A1 | 12/2015 |
| WO | WO 2016/021666 | A1 | 2/2016 |
| WO | WO 2016/181936 | A1 | 11/2016 |

* cited by examiner

SUBSTRATE FOR HIGH-FREQUENCY PRINTED WIRING BOARD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

TECHNICAL FIELD

The present disclosure relates to a substrate for a high-frequency printed wiring board. The present application claims a priority based on Japanese Patent Application No. 2017-153721 filed on Aug. 8, 2017, the entire content of which is incorporated herein by reference.

BACKGROUND ART

In recent years, an amount of communication of information has been continuously increasing. For example, in devices such as an IC card and a mobile phone terminal, communication is frequently performed in a high-frequency region such as microwave or millimeter wave. Therefore, there has been required a printed wiring board allowing for small transmission loss when used in such a high-frequency region, i.e., there has been required a printed wiring board excellent in high-frequency characteristic. As a substrate for manufacturing such a high-frequency printed wiring board, a substrate in which a copper foil is layered on a dielectric layer has been generally used.

As a technique for improving the high-frequency characteristic of the printed wiring board, it has been considered to use, as a material of the dielectric layer, a composite material in which an inorganic filler such as minute glass or a particulate ceramic filler material is included in a fluororesin matrix such as polytetrafluoroethylene (see U.S. Pat. Nos. 4,886,699 and 5,358,775). Moreover, as a method for forming the dielectric layer using such a composite material, the following method has been proposed: dipropylene glycol is mixed as a lubricant to the fine fluoropolymer powder and the inorganic filler, and cold extrusion into a form of a sheet is performed.

Meanwhile, since the fluororesin has a small surface energy, an adhesive strength between the dielectric layer and the copper foil is small. As a technique for increasing the adhesive strength between the dielectric layer including the fluororesin and the copper foil, the following method has been considered: a silane-based coupling agent having a functional group including a N atom or S atom is present in the vicinity of an interface therebetween (see WO 2014/192718).

CITATION LIST

Patent Literature

PTL 1: U.S. Pat. No. 4,886,699
PTL 2: U.S. Pat. No. 5,358,775
PTL 3: WO 2014/192718

SUMMARY OF INVENTION

A first embodiment of a substrate for a high-frequency printed wiring board according to the present disclosure is directed to a substrate for a high-frequency printed wiring board, the substrate including: a dielectric layer including a fluororesin and an inorganic filler; and a copper foil layered on at least one surface of the dielectric layer, wherein a surface of the copper foil at the dielectric layer side has a maximum height roughness (Rz) of less than or equal to 2 μm, and a ratio of the number of inorganic atoms of the inorganic filler to the number of fluorine atoms of the fluororesin in a superficial region of the dielectric layer at the copper foil side is less than or equal to 0.08.

Further, a second embodiment of the substrate for a high-frequency printed wiring board according to the present disclosure is directed to a substrate for a high-frequency printed wiring board, the substrate including: a dielectric layer including a fluororesin and an inorganic filler; and a copper foil layered on at least one surface of the dielectric layer, wherein a surface of the copper foil at the dielectric layer side has a maximum height roughness (Rz) of less than or equal to 2 μm, and in a cross section of the dielectric layer in a direction perpendicular to the copper foil, a ratio of a total cross sectional area of the inorganic filler to an overall cross sectional area in a region at a distance of more than or equal to [18] *0* μm and less than or equal to [22] *2* μm from the copper foil is 0.7 time or less as large as a ratio of a total cross sectional area of the inorganic filler to an overall cross sectional area in a region at a distance of more than or equal to [0] *18* μm and less than or equal to [2] *22* μm from the copper foil. It should be noted that the "cross section of the dielectric layer in the direction perpendicular to the copper foil" means a cross section in a direction perpendicular to the surface of the dielectric layer.

DETAILED DESCRIPTION

Figure 1:
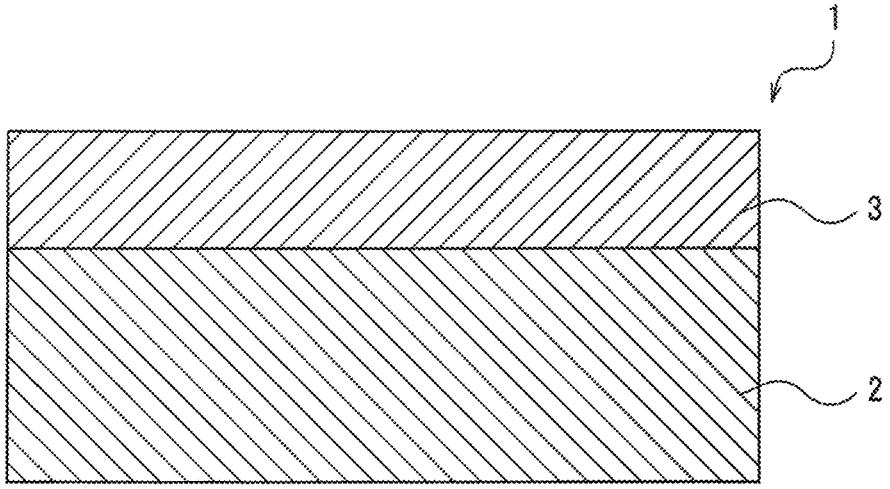
FIG. 1 is a schematic cross sectional view of a substrate for a high-frequency printed wiring board according to a first embodiment of the present disclosure.

[Problem to be Solved by the Present Disclosure]

When the dielectric layer includes the inorganic filler in addition to the fluororesin, the adhesive strength between the dielectric layer and the copper foil are insufficient even with the above-described conventional method. To address this, in this case, it is necessary to use a copper foil having a large roughness so as to increase the adhesive strength by means of an anchor effect, with the result that the high-frequency characteristic of the printed wiring board becomes insufficient, disadvantageously.

The present invention has been made based on the above circumstance and has an object to provide a substrate for an high-frequency printed wiring board, which allows for an improved adhesive strength and allows for an excellent high-frequency characteristic.

[Advantageous Effect of the Present Disclosure]

The substrate for a high-frequency printed wiring board according to the present invention allows for an improved adhesive strength and allows for an excellent high-frequency characteristic.

DESCRIPTION OF EMBODIMENTS

A first embodiment of a substrate for a high-frequency printed wiring board according to the present disclosure is directed to a substrate for a high-frequency printed wiring board, the substrate including: a dielectric layer including a fluororesin and an inorganic filler; and a copper foil layered on at least one surface of the dielectric layer, wherein a surface of the copper foil at the dielectric layer side has a maximum height roughness (Rz) of less than or equal to 2 μm, and a ratio of the number of inorganic atoms of the inorganic filler to the number of fluorine atoms of the fluororesin in a superficial region of the dielectric layer at the copper foil side is less than or equal to 0.08.

In the substrate for a high-frequency printed wiring board, the dielectric layer includes the fluororesin and the inorganic filler; however, an adhesive strength for the smooth copper foil having a Rz of less than or equal to the above-described value can be increased when the atomic ratio of (the inorganic atoms of the inorganic filler)/(the fluorine atoms of the fluororesin) is less than or equal to the specified value above. As a result, since the dielectric layer includes the fluororesin and the inorganic filler and the smooth copper foil can be used in the substrate for a high-frequency printed wiring board, the high frequency characteristic can be excellent. This is presumably due to the following reason. That is, for example, since the ratio of the inorganic filler to the fluororesin in the dielectric layer is small in the vicinity of an adhesion interface with the copper foil, this portion has a relatively low elastic modulus to result in large tensility, with the result that when force to detach from the copper foil is applied to the dielectric layer, the force is scattered in the vicinity of the interface. Accordingly, the force is avoided from being applied only to the interface, whereby the high adhesive strength is obtained.

A second embodiment of the substrate for a high-frequency printed wiring board according to the present disclosure is directed to a substrate for a high-frequency printed wiring board, the substrate including: a dielectric layer including a fluororesin and an inorganic filler; and a copper foil layered on at least one surface of the dielectric layer, wherein a surface of the copper foil at the dielectric layer side has a maximum height roughness (Rz) of less than or equal to 2 μm, and in a cross section of the dielectric layer in a direction perpendicular to the copper foil, a ratio of a total cross sectional area of the inorganic filler to an overall cross sectional area in a region at a distance of more than or equal to [18] *0* μm and less than or equal to [22] *2* μm from the copper foil is 0.7 time or less as large as a ratio of a total cross sectional area of the inorganic filler to an overall cross sectional area in a region at a distance of more than or equal to [0] *18* μm and less than or equal to [2] *22* μm from the copper foil.

In the substrate for a high-frequency printed wiring board, the dielectric layer includes the fluororesin and the inorganic filler; however, an adhesive strength for the smooth copper foil having a Rz of less than or equal to the above-described value can be increased when the multiple value in connection with the amount (the ratio of the total cross sectional area of the inorganic filler) of the inorganic filler in each of the region adjacent to the copper foil and the region distant away from the copper foil is less than or equal to the above-described specified value. As a result, since the dielectric layer includes the fluororesin and the inorganic filler and the smooth copper foil can be used in the substrate for a high-frequency printed wiring board, the high-frequency characteristic can be excellent.

Preferably, a softening temperature of the fluororesin is more than or equal to 250° C. and less than or equal to 310° C. When the softening temperature of the fluororesin thus falls within the above-described range, the dielectric layer and the copper foil can be layered on each other more readily.

Preferably, the fluororesin is a tetrafluoroethylene-hexafluoropropylene copolymer, a tetrafluoroethylene-perfluoroalkyl vinyl ether copolymer, polytetrafluoroethylene, or a combination of the tetrafluoroethylene-hexafluoropropylene copolymer, the tetrafluoroethylene-perfluoroalkyl vinyl ether copolymer, and the polytetrafluoroethylene. More preferably, the fluororesin is the tetrafluoroethylene-hexafluoropropylene copolymer. By thus using each of the above-described resins as the fluororesin, the dielectric layer and the copper foil can be layered on each other readily.

Preferably, a mass ratio of the inorganic filler to the fluororesin in the dielectric layer is more than or equal to 1.0. By thus setting the mass ratio of the inorganic filler to the fluororesin to fall within the above-described range, thermal contraction of the dielectric layer can be small, with the result that residual stress after heat press becomes small. Accordingly, a higher adhesive strength can be obtained. Moreover, warpage of the substrate for a high-frequency printed wiring board can be suppressed.

The inorganic filler may include silica. Silica is comparatively inexpensive, has a permittivity of 3.8 (1 MHz), which is not large, and is less changed by a temperature in a temperature range (for example, from −10° C. to 150° C.) in which a substrate is generally used. Moreover, various sizes of silica can be obtained readily in the market. By selecting an appropriate size thereof, physical property variation within a plane of the substrate can be suppressed while maintaining flexibility of the substrate. Furthermore, since the specific gravity of silica is close to that of the fluororesin, silica is less likely to settle down and a degree of settling-down can be controlled with precision.

A linear expansion coefficient of the substrate for a high-frequency printed wiring board in a thickness direction may be less than or equal to 50 ppm/K. Moreover, a change of permittivity of the substrate for a high-frequency printed wiring board by a temperature in a range of 25° C. to 120° C. may be less than or equal to 2%. Thus, according to the substrate for a high-frequency printed wiring board, the linear expansion coefficient in the thickness direction can be small and the change of the permittivity by the temperature can be small, whereby conductivity characteristic and antenna characteristic of a high-frequency device can be suppressed from being changed and these characteristics of the high-frequency device can be designed readily.

Details of Embodiments of the Present Disclosure

With reference to figures, the following describes a substrate for a high-frequency printed wiring board and a method for manufacturing the substrate for a high-frequency printed wiring board according to an embodiment of the present disclosure.

Substrate for High-Frequency Printed Wiring Board

First Embodiment

As shown in FIG. 1, a substrate 1 for a high-frequency printed wiring board according to a first embodiment includes a dielectric layer 2 and a copper foil 3 layered on dielectric layer 2. The substrate for a high-frequency printed wiring board is used as a substrate of a printed wiring board.

(Dielectric Layer)

Dielectric layer 2 includes a fluororesin and an inorganic filler.

(Fluororesin)

The fluororesin refers to a resin in which a fluorine atom or an organic group (hereinafter, also referred to as "fluorine atom containing group") including a fluorine atom substitutes for at least one of hydrogen atoms coupled to carbon atoms included in a repeating unit of a high polymer chain. The fluorine atom containing group is such a group that a fluorine atom substitutes for at least one of hydrogen atoms in a straight-chain or branched organic group. Examples of the fluorine atom containing group include a fluoroalkyl group, a fluoroalkoxy group, a fluoropolyether group, and the like.

The above-described "fluoroalkyl group" means an alkyl group in which a fluorine atom substitutes for at least one hydrogen atom. Examples thereof include a "perfluoroalkyl group" and the like. Specific examples of the fluoroalkyl group include: a group in which fluorine atoms substitute for all the hydrogen atoms of the alkyl group; a group in which fluorine atoms substitute for hydrogen atoms other than one terminal hydrogen atom of the alkyl group; and the like.

The above-described "fluoropolyether group" means a monovalent group having an oxyalkylene unit as a repeating unit and having an alkyl group or a hydrogen atom at its terminal, wherein a fluorine atom substitutes for at least one hydrogen atom of the alkylene oxide chain or the terminal alkyl group. Examples of the fluoropolyether group include: a "perfluoropolyether group" having a plurality of perfluoroalkylene oxide chains as a repeating unit; and the like.

The lower limit of the softening temperature of the fluororesin is preferably 250° C. and is more preferably 270° C. When the softening temperature of the fluororesin is more than or equal to the above-described lower limit, thermal resistance to a solder reflow process can be provided. The upper limit of the above-described softening temperature is preferably 310° C., and is more preferably 300° C. When the softening temperature of the fluororesin is less than or equal to the above-described upper limit, dielectric layer 2 and copper foil 3 can be readily layered on each other.

Examples of the fluororesin includes: polytetrafluoroethylene (PTFE); a tetrafluoroethylene-perfluoroalkyl vinyl ether copolymer (PFA); a tetrafluoroethylene-hexafluoropropylene copolymer (FEP); a tetrafluoroethylene-ethylene copolymer (PFE); polyvinylidene fluoride (PVDF); polychlorotrifluoroethylene (PCTFE); a chlorotrifluoroethylene-ethylene copolymer (ECTFE); polyvinyl fluoride (PVF); and a thermoplastic fluororesin (THV) and a fluoroelastomer, each of which is composed of three types of monomers, i.e., tetrafluoroethylene, hexafluoropropylene, and vinylidene fluoride. Moreover, a mixture or copolymer including these compounds can be used as the above-described fluororesin.

Among these, the tetrafluoroethylene-hexafluoropropylene copolymer (FEP), the tetrafluoroethylene-perfluoroalkyl vinyl ether copolymer (PFA), polytetrafluoroethylene (PTFE), and a combination thereof are preferable. By using each of the above-described resins as the fluororesin, the dielectric layer and the copper foil can be layered on each other readily, and the thermal resistance to a solder reflow process can be provided.

The FEP, PFA, and PTFE are preferable as the fluororesin presumably because these fluororesins have a small high-frequency characteristic, particularly, a small dielectric loss tangent. Moreover, among fluororesins, these fluororesins can be readily produced to have a high molecular weight, and such fluororesins each having a high molecular weight are considered to have excellent tensility and the like. Hence, even when a filler is mixed to each of these fluororesins, the characteristics of the fluororesin such as flexibility and high tensility can be maintained, with the result that it is expected to maintain high adhesion.

The molecular weight (weight average molecular weight) of the FEP is preferably more than or equal to 200,000 and less than or equal to 1,200,000, is more preferably more than or equal to 300,000 and less than or equal to 1,000,000, and is further preferably more than or equal to 400,000 and less than or equal to 1,000,000. The molecular weight (weight average molecular weight) of the PFA is preferably more than or equal to 200,000 and less than or equal to 1,200,000, is more preferably more than or equal to 300,000 and less than or equal to 1,000,000, and is further preferably more than or equal to 400,000 and less than or equal to 1,000,000. The molecular weight (weight average molecular weight) of the PTFE is preferably more than or equal to 1,000,000 and less than or equal to 10,000,000, and is more preferably more than or equal to 1,500,000 and less than or equal to 5,000,000.

The lower limit of the content of the fluororesin in dielectric layer 2 is preferably 10 volume %, is more preferably 20 volume %, and is further preferably 30 volume %. On the other hand, the upper limit of the content of the fluororesin is preferably 80 volume %, is more preferably 60 volume %, and is further preferably 40 volume %.

(Inorganic Filler)

The inorganic filler is a filler including an inorganic atom. The inorganic atom means a metal atom or a semimetal atom. The inorganic filler may include one type or two or more types of inorganic atoms. It should be noted that the inorganic filler needs to be an insulator.

Examples of the metal atom include group 1 to group 13 metal atoms in the periodic table. Among these, magnesium, calcium, barium, titanium, zirconium, and aluminum are preferable.

Examples of the semimetal atom include boron, silicon, and the like. Among these, silicon is preferable.

Examples of the inorganic filler include titanium oxide, talc, silica, aluminum oxide, zirconium oxide, barium sulfate, calcium carbonate, aluminum hydroxide, magnesium hydroxide, potassium titanate, magnesium oxide, calcium oxide, clay, and the like. Among these, silica, titanium oxide, and talc are preferable. Silica is more preferable. It should be noted that one type or two or more types of inorganic fillers may be included.

The shape of the inorganic filler is not limited particularly. Examples of the shape of the inorganic filler include a particulate shape, a spherical shape, a scale-like shape, a needle-like shape, and the like. When the shape is the scale-like or needle-like shape, higher adhesion can be attained by arranging the filler having anisotropy. Moreover, the spherical-shaped filler is preferable due to the following points: the spherical-shaped filler has a small surface area and therefore has a small influence over the characteristics of the fluororesin; and when blended with a liquid material, a degree of thickening is small.

The lower limit of the average particle size of the inorganic filler is preferably 0.1 μm, and is more preferably 0.5 Moreover, the upper limit of the average particle size of the inorganic filler is preferably 10 μm, and is more preferably 5 μm. When the average particle size of the inorganic filler is less than the above-described lower limit, the characteristics of the fluororesin such as flexibility may be decreased. On the other hand, when the average particle size of the inorganic filler is more than the above-described upper limit, the characteristics may be greatly varied among portions in the dielectric layer of the substrate for a high-frequency printed wiring board. It should be noted that the term "average particle size" herein means a particle size represented by center size D50 of a volume particle size distribution in a fluid dispersion.

The lower limit of the content of the inorganic filler in dielectric layer 2 is preferably 10 volume %, is more preferably 20 volume %, and is further preferably 30 volume %. Moreover, the upper limit of the content of the inorganic filler is preferably 90 volume %, is more preferably 70 volume %, and is further preferably 60 volume %.

(Mass Ratio of Inorganic Filler to Fluororesin)

The lower limit of the mass ratio (inorganic filler/fluororesin) of the inorganic filler to the fluororesin in dielectric layer 2 is preferably 1.0, is more preferably 1.1, is further preferably 1.2, and is particularly preferably 1.3. The upper limit of the above-described mass ratio is, for example, 3.0, and is preferably 2.0. By setting the mass ratio of the fluororesin and the inorganic filler to fall within the above-described range, thermal contraction of dielectric layer 2 can be small, with the result that residual stress after heat press can be small. Accordingly, a higher adhesive strength can be obtained. Moreover, warpage of the substrate for a high-frequency printed wiring board can be suppressed.

Particularly, when silica is used as the inorganic filler, by setting the mass ratio of the silica to the fluororesin to be more than or equal to 1.0, the linear expansion coefficient of the substrate for a high-frequency printed wiring board in the thickness direction can be suppressed to be less than or equal to 50 ppm/K. Moreover, a change of the permittivity thereof by a temperature in a range of 25° C. to 120° C. can be suppressed to be less than or equal to 2%.

Further, for example, as optional components, dielectric layer 2 can include an engineering plastic, a flame retardant, a flame retardant aid, a pigment, an antioxidant, a reflecting agent, a masking agent, a lubricant, a process stabilizer, a plasticizer, a foaming agent, and the like. In this case, the upper limit of the total content of the optional components in dielectric layer 2 is preferably 50 mass %, is more preferably 40 mass %, and is further preferably 30 mass %.

The above-described engineering plastic to be used can be selected from known engineering plastics in accordance with required characteristics of dielectric layer 2. Typically, an aromatic polyether ketone can be used.

This aromatic polyether ketone is a thermoplastic resin having a structure in which benzene rings are coupled at para positions and are connected to each other by a rigid ketone bond (—C(=O)—) or a flexible ether bond (—O—). Examples of the aromatic polyether ketone include: polyetheretherketone (PEEK) having a structural unit in which an ether bond, a benzene ring, an ether bond, a benzene ring, a ketone bond, and a benzene ring are arranged in this order; and polyetherketone (PEK) having a structural unit in which an ether bond, a benzene ring, a ketone bond, and a benzene ring are arranged in this order. Of these, PEEK is preferable as the aromatic polyether ketone. Such an aromatic polyether ketone is excellent with regard to wear resistance, thermal resistance, insulating property, processability, and the like.

As the aromatic polyether ketone such as PEEK, a commercially available aromatic polyether ketone can be used. For example, a commercially available aromatic polyether ketone in a single grade may be used, aromatic polyether ketones in a plurality of grades may be used, or a modified aromatic polyether ketone may be used.

As the above-described flame retardant, various types of known flame retardants can be used. Examples thereof include: a halogen-based flame retardant such as a bromine-based flame retardant or a chlorine-based flame retardant; and the like.

As the above-described flame retardant aid, various types of known flame retardant aids can be used, such as antimony trioxide and the like.

As the above-described pigment, various types of known pigments can be used, such as titanium oxide and the like.

As the above-described antioxidant, various types of known antioxidants can be used, such as a phenol-based antioxidant and the like.

As the above-described reflecting agent, various types of known reflecting agents can be used, such as titanium oxide and the like.

Moreover, dielectric layer 2 may be provided with a hollow structure. In this case, the relative permittivity of dielectric layer 2 can be made small, whereby the transmission loss can be suppressed more effectively and the high-frequency characteristic can be more improved.

The lower limit of the average thickness of dielectric layer 2 is preferably 5 μm and is more preferably 10 μm. On the other hand, the upper limit of the average thickness of dielectric layer 2 is preferably 0.2 mm, is more preferably 0.1 mm, and is particularly preferably 70 μm. When the average thickness of dielectric layer 2 is less than the above-described lower limit, the strength of dielectric layer 2 becomes insufficient, with the result that ease of handling may be decreased. Conversely, when the average thickness of dielectric layer 2 is more than the above-described upper limit, it may become difficult to apply the substrate to an electronic device that requires flexibility. It should be noted that the term "average thickness" as used herein means an average value obtained by measuring thicknesses at arbitrary ten points.

The lower limit of the relative permittivity of dielectric layer 2 is preferably 1.2, is more preferably 1.4, and is further preferably 1.6. On the other hand, the upper limit of the relative permittivity of dielectric layer 2 is preferably 3.0, is more preferably 2.8, and is further preferably 2.5.

<Copper Foil>

Copper foil 3 is layered on one surface of dielectric layer 2 as shown in FIG. 1.

A main component of copper foil 3 is copper or a copper alloy. Copper foil 3 can be manufactured by a known method. The "main component" refers to a component having the largest content, such as a component having a content of more than or equal to 50 mass %.

The lower limit of the average thickness of copper foil 3 is preferably 1 μm, is more preferably 5 μm, and is further preferably 10 μm. On the other hand, the upper limit of the average thickness is preferably 100 μm, is more preferably 50 μm, and is further preferably 20 μm. When the above-described average thickness is less than the above-described lower limit, the strength of an electric conduction pattern to be formed may be decreased. Moreover, ease of handling may be decreased. On the other hand, when the above-described average thickness is more than the above-described upper limit, the thickness of substrate 1 for a high-frequency printed wiring board may be increased too much.

The upper limit of the maximum height roughness (Rz) of the surface of copper foil 3 at the dielectric layer 2 side is 2 μm, is preferably 1.5 μm, is more preferably 1 μm, and is further preferably 0.7 μm. The lower limit of Rz is preferably 0.05 μm, is more preferably 0.1 μm, and is further preferably 0.2 μm. When Rz is more than the above-described upper limit, the high-frequency characteristic of substrate 1 for a high-frequency printed wiring board may be decreased. Conversely, when Rz is less than the above-described lower limit, the manufacturing cost of substrate 1 for a high-frequency printed wiring board may be increased. Moreover, the adhesive strength may become small. Rz is a value measured in accordance with a method described in JIS-B0601:2013.

(State of Presence of Inorganic Filler in Each Region of Dielectric Layer)

By configuring a state of presence of the inorganic filler in each region of dielectric layer 2 in the following first manner, second manner, or third manner, the adhesive strength between dielectric layer 2 and copper foil 3 can be improved.

(First Manner)

The adhesive strength between dielectric layer 2 and copper foil 3 can be improved when a ratio (hereinafter, referred to as "atomic ratio (A)") of the number of the inorganic atoms of the inorganic filler to the number of the fluorine atoms of the fluororesin in a superficial region of dielectric layer 2 at the copper foil 3 side falls within a below-described range. This atomic ratio (A) can be determined by obtaining peaks of the inorganic atoms and the fluorine atoms using energy dispersive X-ray analysis (EDX) and converting the peak areas in accordance with sensitivity of each atom.

The upper limit of the atomic ratio (A) is 0.08, is preferably 0.07, is more preferably 0.05, is further preferably 0.03, and is particularly preferably 0.01. The superficial region at the copper foil 3 side refers to a region in a depth range measured by EDX after detaching copper foil 3 from dielectric layer 2. This depth range corresponds to a distance of more than or equal to 0 μm and less than or equal to 0.25 μm from copper foil 3 when, for example, "FlatQUAD XFlash 5060F" provided by Bruker is used as a measuring device for EDX and an acceleration voltage is set to 5 keV. It should be noted that in order to suppress the permittivity from being changed due to a temperature and suppress the conductivity characteristic, antenna characteristic, and the like of the high-frequency device from being changed, a small amount of the inorganic filler preferably exists also in the vicinity of the copper foil surface. The lower limit of the atomic ratio (A) is preferably 0.001.

(Second Manner)

Figure 3:
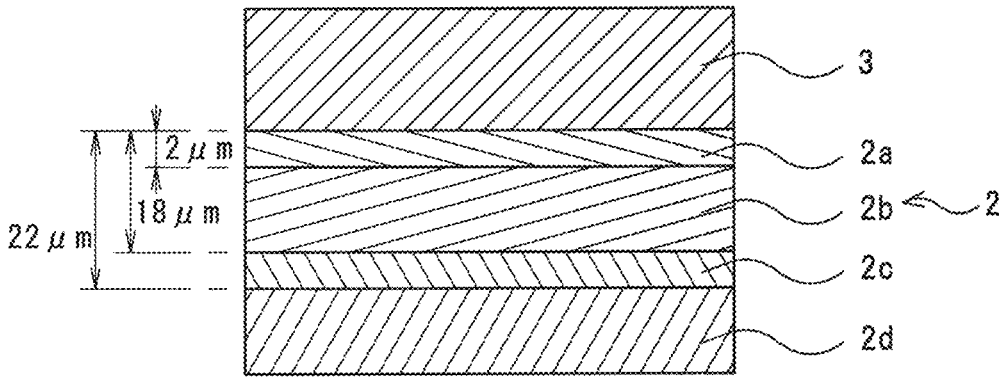
FIG. 3 is a schematic cross sectional view of the substrate for a high-frequency printed wiring board to show regions in each of which a ratio of a cross sectional area of an inorganic filler is measured.

The adhesive strength between dielectric layer 2 and copper foil 3 can be improved when a value (hereinafter, referred to as "multiple value (C)") of multiple of an area ratio (B-1) with respect to an area ratio (B-2) falls within a below-described range, wherein as shown in FIG. 3, in a cross section of dielectric layer 2 in a direction perpendicular to copper foil 3, the area ratio (B-1) is represented by a ratio (B) of a total cross sectional area of the inorganic filler to an overall cross sectional area in a region (hereinafter, also referred to as "region (2a)") at a distance of more than or equal to 0 μm and less than or equal to 2 μm from the copper foil, and the area ratio (B-2) is represented by a ratio (B) of a total cross sectional area of the inorganic filler to an overall cross sectional area in a region (hereinafter, also referred to as "region (2c)") at a distance of more than or equal to 18 μm and less than or equal to 22 μm from the copper foil.

The upper limit of the multiple value (C) is 0.7, and is preferably 0.5, is more preferably 0.4, is further preferably 0.3, and is particularly preferably 0.2. It should be noted that in order to suppress the permittivity from being changed due to a temperature and suppress the conductivity characteristic, antenna characteristic, and the like of the high-frequency device from being changed, a small amount of the inorganic filler preferably exists also in the vicinity of the copper foil surface. The lower limit of the multiple value (C) is, for example, 0.0 and is preferably 0.01.

Each of the respective values of the area ratio (B-1) for the region (2a) and the area ratio (B-2) for the region (2c) is determined, as a value of the ratio of the total cross sectional area of the inorganic filler to the overall cross sectional area, by: using a cross section polisher to obtain a precise polished cross section of dielectric layer 2 in the direction perpendicular to copper foil 3; obtaining an image of this cross section using a scanning electron microscope (SEM); and performing a binarization process to each of the regions (the regions (2a) and (2c)) in this SEM image.

(Third Manner) The adhesive strength between dielectric layer 2 and copper foil 3 can be improved when the above-described ratio (B) of the total cross sectional area of the inorganic filler to the overall cross sectional area is gradually decreased from a point at a distance of 20 μm from the copper foil to a point at a distance of 0 μm from the copper foil in dielectric layer 2. In the third manner, the value of the above-described ratio (B) may be decreased linearly or may be decreased curvilinearly as long as the value of the above-described ratio (B) is gradually decreased from the point at the distance of 20 μm to the point at the distance of 0 μm.

The lower limit of detachment strength of dielectric layer 2 with respect to copper foil 3 is preferably 9 N/cm, is more preferably 10 N/cm, and is further preferably 12 N/cm in peel strength. The upper limit of the above-described detachment strength is 20 N/cm, for example. When the detachment strength is more than or equal to the foregoing value, the substrate for a high-frequency printed wiring board can be suitably used as a substrate of a high-frequency device.

Second Embodiment

Figure 2:
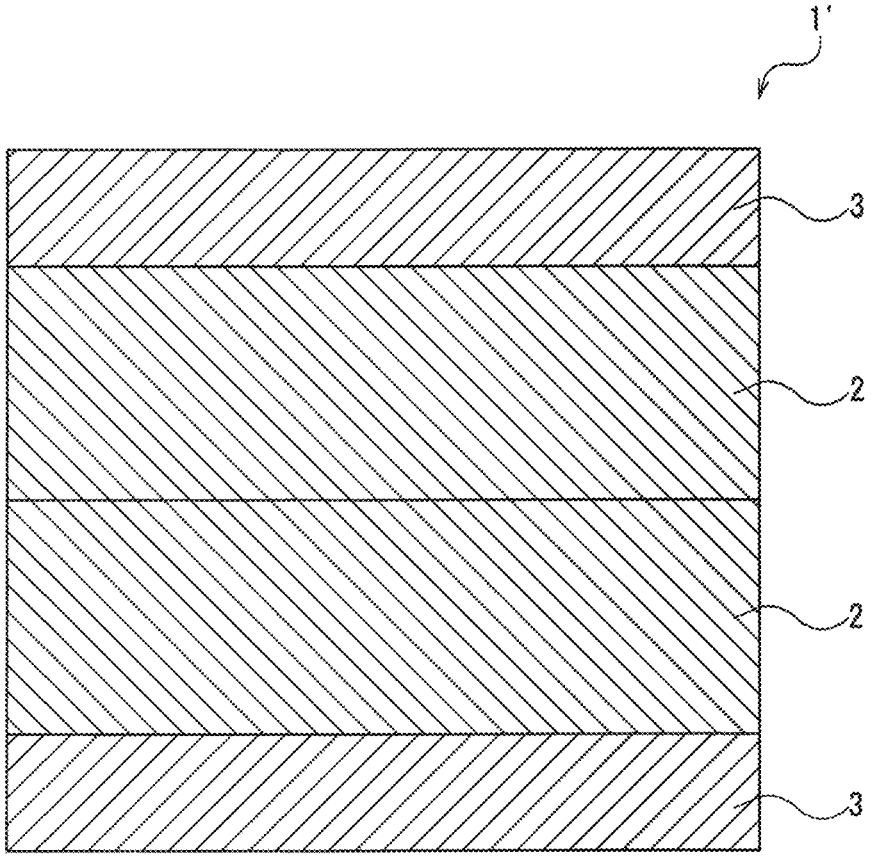
FIG. 2 is a schematic cross sectional view of a substrate for a high-frequency printed wiring board according to a second embodiment of the present disclosure.

As shown in FIG. 2, a substrate 1' for a high-frequency printed wiring board according to a second embodiment includes: two dielectric layers 2 layered on each other; and two copper foils 3 respectively layered on these dielectric layers 2. Substrate 1' for a high-frequency printed wiring board normally has the following structure: two substrates 1 for high-frequency printed wiring boards are stacked on each other such that the respective sides of dielectric layers 2 opposite to copper foils 3 face each other.

In substrate 1' for a high-frequency printed wiring board, dielectric layer 2 and copper foil 3 are respectively the same as dielectric layer 2 and copper foil 3 in substrate 1 for a high-frequency printed wiring board.

Third Embodiment

Figure 4:
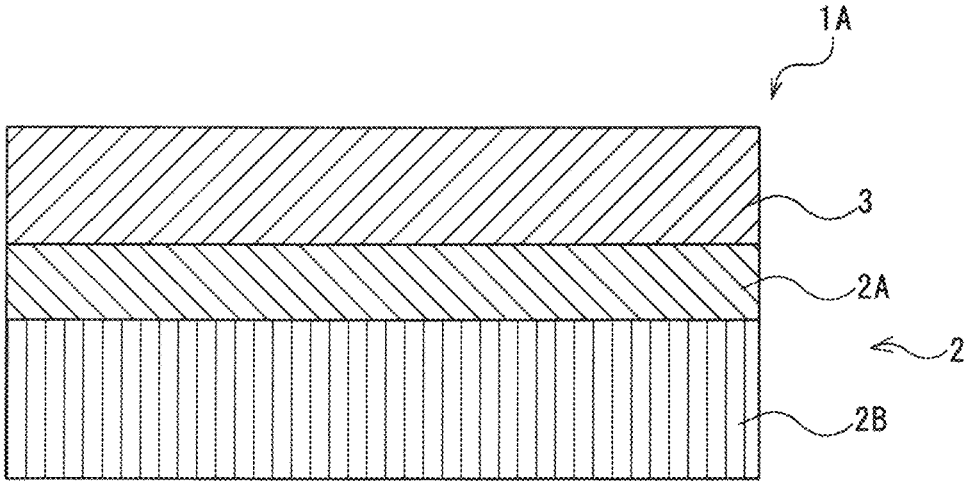
FIG. 4 is a schematic cross sectional view of a substrate for a high-frequency printed wiring board according to a third embodiment of the present disclosure.

As shown in FIG. 4, a substrate 1A for a high-frequency printed wiring board according to a third embodiment includes: a dielectric layer 2 including a layer 2A and a layer 2B; and a copper foil 3 layered on layer 2A. Layer 2A is a layer that includes a fluororesin and that includes no inorganic filler or a smaller amount of inorganic filler than that in layer 2B. Layer 2B is a layer including a fluororesin and an inorganic filler.

In substrate 1A for a high-frequency printed wiring board, layer 2B and copper foil 3 are respectively the same as dielectric layer 2 and copper foil 3 in substrate 1 for a high-frequency printed wiring board. Layer 2A is the same as dielectric layer 2 of substrate 1 for a high-frequency printed wiring board when dielectric layer 2 of substrate 1 does not include the inorganic filler.

Fourth Embodiment

Figure 5:
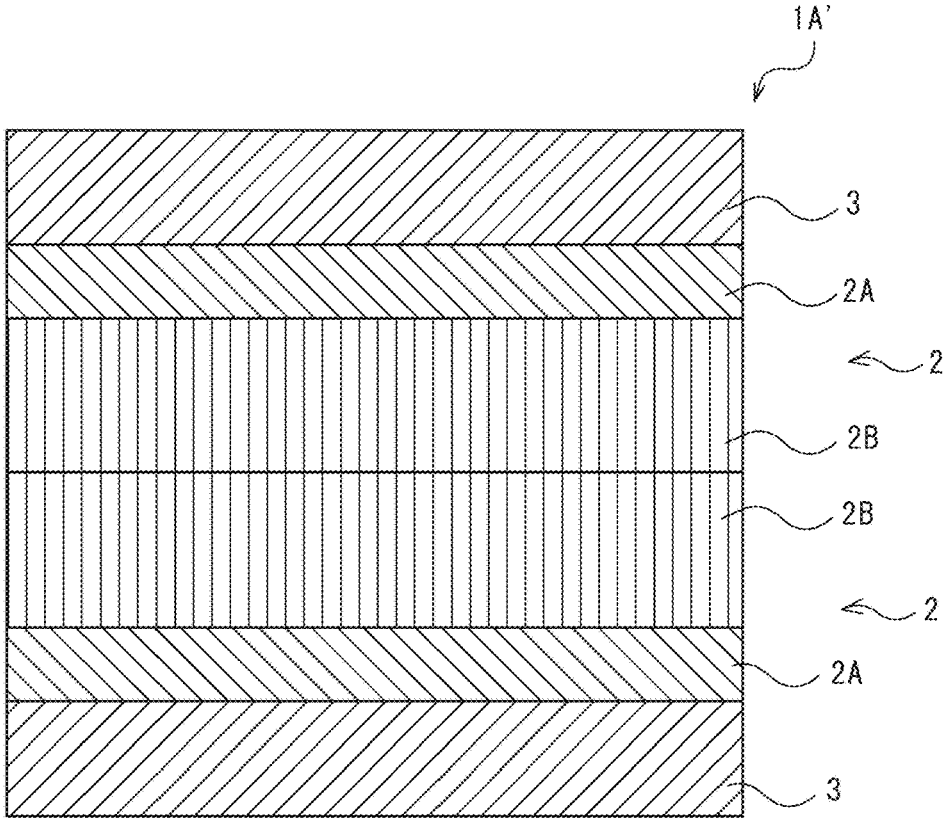
FIG. 5 is a schematic cross sectional view of a substrate for a high-frequency printed wiring board according to a fourth embodiment of the present disclosure.

As shown in FIG. 5, a substrate 1A' for a high-frequency printed wiring board according to a fourth embodiment includes: two dielectric layers 2 each including a layer 2A and a layer 2B, dielectric layers 2 being stacked on each other such that respective layers 2B of dielectric layers 2 face each other; and two copper foils 3 respectively layered on layers 2A. Substrate 1A' for a high-frequency printed wiring board includes: two dielectric layers 2; and two copper foils 3 respectively layered on dielectric layers 2. Substrate 1A' for a high-frequency printed wiring board normally has the following structure: two substrates 1A for high-frequency printed wiring boards are stacked on each other such that layers 2B of dielectric layers 2 face each other.

Fifth Embodiment

Figure 6:
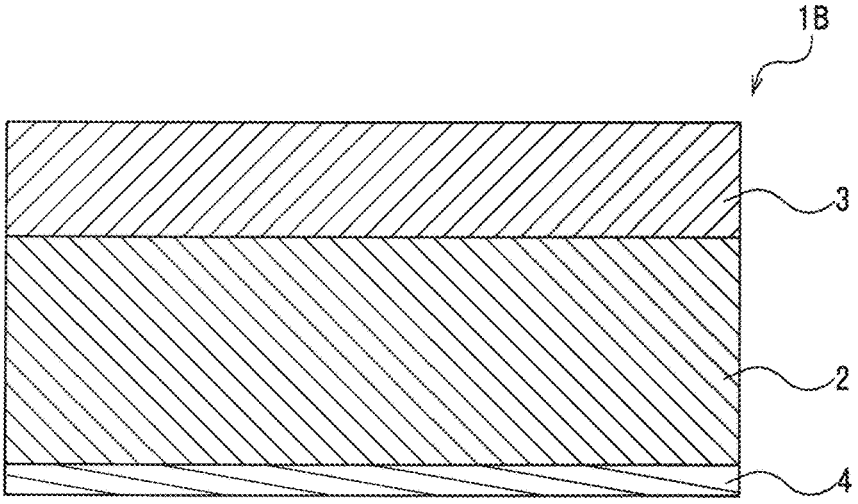
FIG. 6 is a schematic cross sectional view of a substrate for a high-frequency printed wiring board according to a fifth embodiment of the present disclosure.

As shown in FIG. 6, a substrate 1B for a high-frequency printed wiring board according to a fifth embodiment includes: a dielectric layer 2; a copper foil 3 layered on dielectric layer 2; and a reinforcement layer 4 layered on a side of dielectric layer 2 opposite to copper foil 3. By providing reinforcement layer 4, thermal contraction in a plane of the high-frequency printed wiring board can be further suppressed.

A reinforcing material of reinforcement layer 4 is not limited particularly as long as the reinforcing material has a linear expansion coefficient smaller than that of dielectric layer 2, but desirably has: an insulating property; thermal resistance with which the reinforcing material is not melted and does not flow at the melting point of the fluororesin; a tensile strength more than or equal to that of the fluororesin; and corrosion resistance. For example, such a reinforcing material can be composed of: a glass cloth in which glass is formed in the form of a cloth; a fluororesin-containing glass cloth obtained by impregnating such a glass cloth with a fluororesin; a resin cloth including a heat-resistant fiber composed of a metal, a ceramic, polytetrafluoroethylene, polyetheretherketone, polyimide, aramid, or the like; and a heat-resistant film including polytetrafluoroethylene, a liquid crystal polymer, polyimide, polyamide-imide, polybenzimidazole, polyetheretherketone, polytetrafluoroethylene, a tetrafluoroethylene-perfluoroalkyl vinyl ether copolymer, a heat-curing resin, a cross-linked resin, or the like. The resin cloth is preferably woven in plain weave in order to obtain thin reinforcement layer 4, but is preferably woven in twill weave and satin weave in order to obtain bendable dielectric layer 2 and the like. In addition to these, a known weave is applicable.

Sixth Embodiment

Figure 7:
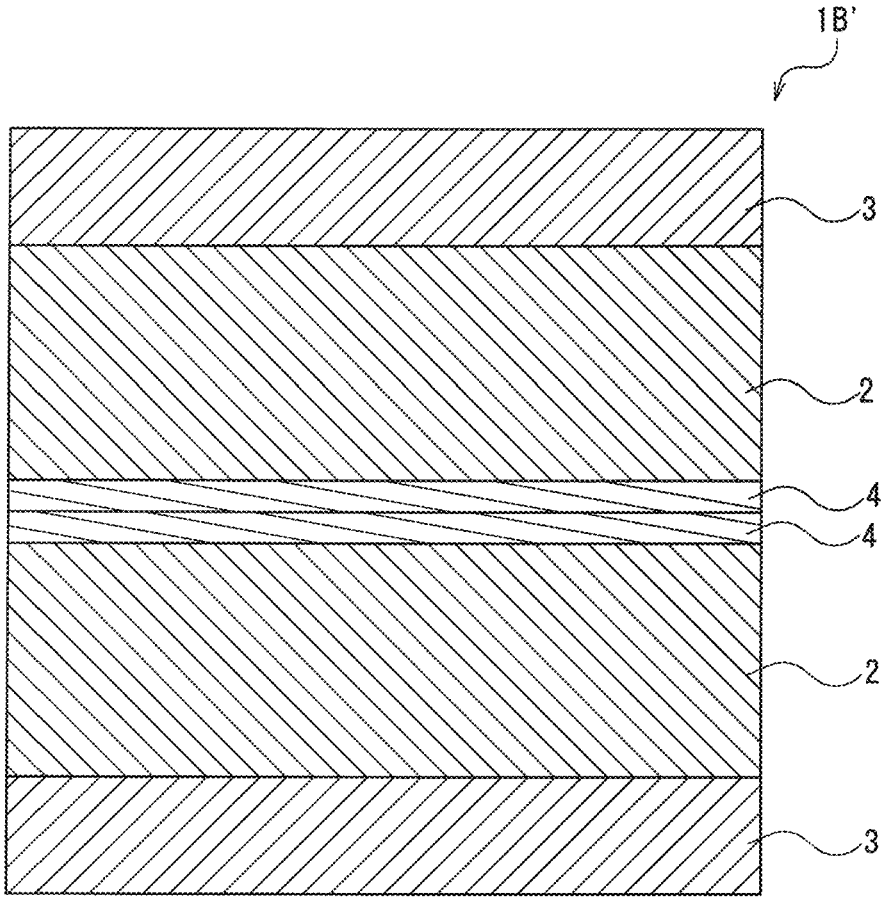
FIG. 7 is a schematic cross sectional view of a substrate for a high-frequency printed wiring board according to a sixth embodiment of the present disclosure.

As shown in FIG. 7, a substrate 1B' for a high-frequency printed wiring board according to a sixth embodiment includes: two reinforcement layers 4 layered on each other; two dielectric layers 2 respectively layered on reinforcement layers 4; and two copper foils 3 respectively layered on dielectric layers 2. Substrate 1B' for a high-frequency printed wiring board normally has the following structure: two substrates 1B for high-frequency printed wiring boards are stacked on each other such that reinforcement layers 4 face each other.

[Method for Manufacturing Substrate for High-Frequency Printed Wiring Board]

Next, the following describes a method for manufacturing substrate 1 for a high-frequency printed wiring board. Examples of the method for manufacturing substrate 1 for a high-frequency printed wiring board include a first manufacturing method embodiment, a second manufacturing method embodiment, and a third manufacturing method embodiment as described below.

<First Manufacturing Method Embodiment>

A method for manufacturing a substrate for a high-frequency printed wiring board according to the first manufacturing method embodiment of the present disclosure includes:

a step (first application step) of applying, onto an upper surface of a detachable substrate, a composition (hereinafter, also referred to as "composition (I)") containing a fluororesin, an inorganic filler, and a dispersion medium;

a step (drying step) of drying the applied layer formed through the first application step;

a step of detaching the applied layer (dielectric layer) from the detachable substrate; and a step (layering step) of layering, on the upper surface of the applied layer, a copper foil or a dielectric layer having a copper foil layered thereon. The detachable substrate may be, for example, a metal plate, a ceramic plate, or the like as long as the detachable substrate has a small strength of adhesion with the applied layer. In the layering step, for example, a reinforcing material such as the above-described glass cloth may be inserted between the dielectric layers in order to form a reinforcement layer. Moreover, the reinforcing material such as the glass cloth may be used instead of the detachable substrate, or a layered body of the reinforcement layer and the applied layer may be formed by forming the applied layer on the reinforcing material provided on the detachable substrate.

According to the manufacturing method in the first manufacturing method embodiment, by settling down the inorganic filler in the applied layer in the drying step, the atomic ratio (A) in the superficial region of dielectric layer 2 at the copper foil 3 side and the multiple value (C) in dielectric layer 2 can be adjusted to be values in the above-described ranges. Moreover, a degree of settling-down of the inorganic filler can be controlled by adjusting the length of a time of the drying step and by providing a resting step before the drying step.

<Second Manufacturing Method Embodiment>

A method for manufacturing a substrate for a high-frequency printed wiring board according to the second manufacturing method embodiment of the present disclosure includes:

a step (second application step) of applying, onto an upper surface of a copper foil, a composition (I) containing a fluororesin, an inorganic filler, and a dispersion medium;

a step (reversing step) of reversing, to be upside down, the applied layer formed through the second application step; and a step (drying step) of drying the applied layer after the above-described reversing step.

According to the manufacturing method in the second manufacturing method embodiment, by settling down the inorganic filler in the applied layer in the drying step after performing the reversing step, the atomic ratio (A) in the superficial region of dielectric layer 2 at the copper foil 3 side and the multiple value (C) in dielectric layer 2 can be adjusted to be values in the above-described ranges.

<Third Manufacturing Method Embodiment>

A method for manufacturing a substrate for a high-frequency printed wiring board according to a third manufacturing method embodiment of the present disclosure includes:

a step (third application step) of applying, onto an upper surface of a copper foil, a composition (hereinafter, also referred to as "composition (H)") containing a fluororesin and a dispersion medium;

a step (drying step) of drying the applied layer formed through the above-described third application step;

a step (fourth application step) of applying the composition (I) to the upper surface of the applied layer after the drying step; and a step (drying step) of drying the applied layer formed through the fourth application step. It should be noted that the composition (II) applied in the third application step may be the same as the composition (I) used in the fourth application step, or may be a composition having an inorganic filler content ratio smaller than that of the composition used in the fourth application step.

According to the manufacturing method in the third manufacturing method embodiment, since no inorganic filler exists in the region of dielectric layer 2 adjacent of copper foil 3, the atomic ratio (A) in the superficial region of dielectric layer 2 at the copper foil 3 side and the multiple value (C) in dielectric layer 2 can be values in the above-described ranges.

(First Application Step)

In the first application step, the composition (I) is applied onto the upper surface of the substrate.

(Composition (I))

The composition (I) is a composition containing a fluororesin, an inorganic filler, and a dispersion medium.

As the fluororesin and the inorganic filler, the above-described fluororesin and inorganic filler included in the dielectric layer of the substrate for a high-frequency printed wiring board can be used.

The fluororesin is used normally in the form of fine particles. The lower limit of the average particle size of the fluororesin is preferably 0.1 μm, and is more preferably 1 μm. The upper limit of the average particle size of the fluororesin is preferably 150 μm, and is more preferably 100 μm.

The dispersion medium is not limited particularly and various organic solvents, oils, lubricants, and the like can be used. By appropriately selecting the dispersion medium in view of viscosity, polarity, volatilization temperature, volatilization rate, and the like, film formation and dispersibility of the inorganic filler can be suitably controlled, whereby the substrate for a high-frequency printed wiring board can be manufactured more readily.

Examples of the dispersion medium include:

a ketone such as methyl ethyl ketone, 2-heptanone, or cyclohexanone;

a hydrocarbon such as hexane, octane, cyclohexane, or ethylcyclohexane;

a diol such as ethylene glycol, diethylene glycol, propylene glycol, or dipropylene glycol;

a diol monoester such as ethylene glycol monoacetate, propylene glycol monoacetate, diethylene glycol monoacetate, or dipropylene glycol monoacetate;

a diol monoether monoester such as ethylene glycol monomethyl ether acetate, ethylene glycol monoethyl ether acetate, propylene glycol monomethyl ether acetate, or propylene glycol monoethyl ether acetate;

a diol diether such as diethylene glycol diethyl ether;

a diol diester such as propylene glycol diacetate;

a diol monoether such as propylene glycol monomethyl ether;

a carboxylate such as cyclohexyl acetate, ethyl lactate, or butyl acetate; and various types of silicone oils.

Among these, the diol is preferable and the dipropylene glycol is more preferable in view of dispersibility of the fluororesin and the inorganic filler and the setting-down of the inorganic filler.

The substrate to which the composition (I) is applied is not limited particularly, and there can be used the glass cloth described as the reinforcing material included in the dielectric layer of the substrate for a high-frequency printed wiring board, for example.

A method for mixing and applying the fluororesin, the inorganic filler, and the dispersion medium is not limited particularly. Examples thereof include: a method for forming a sheet-like applied layer by performing mixing and extrusion using a blender such as a Patterson Kelly Vee Blender.

(Second Application Step)

In the second application step, the composition (I) is applied to the upper surface of the copper foil.

As the copper foil, there can be used the copper foil described as the copper foil of the substrate for a high-frequency printed wiring board. The composition (I) is the same as that described with regard to the first application step.

Examples of the application method includes: the method described with regard to the first application step; and the like.

(Third Application Step)

In the third application step, the composition (II) is applied to the upper surface of the copper foil.

(Composition (II))

The composition (II) is a composition containing a fluororesin and a dispersant.

As the fluororesin, there can be used the fluororesin described as the fluororesin included in the dielectric layer of the substrate for a high-frequency printed wiring board. As the dispersant, there can be used the dispersant described as the dispersant included in the composition (I). As the copper foil, there can be used the copper foil described as the copper foil of the substrate for a high-frequency printed wiring board.

Examples of the application method include: the method described with regard to the first application step; and the like.

The upper limit of the average thickness of the applied layer in the third application step is preferably 6 μm, and is more preferably 3 μm. The lower limit of the average thickness of the applied layer is preferably 0.01 μm, and is more preferably 0.1 μm.

(Fourth Application Step)

In the fourth application step, the composition (I) is applied to the upper surface of the applied layer after the drying step.

This leads to formation of a configuration in which the area ratio (B) is less than or equal to a certain value in the region (2a) as compared with the region (2c).

(Resting Step)

The resting step can be performed before the drying step. As a result of this step, the inorganic filler is more settled down in the composition of the applied layer, whereby the ratio of the inorganic filler/the fluororesin becomes small in the upper portion of the applied layer.

(Reversing Step)

In the reversing step, the applied layer is reversed to be upside down. The reversing step is normally performed by reversing the front side and back side of the layered body including the applied layer. On this occasion, in order to prevent falling of the applied layer, it is desirable to cover it with the reinforcing material such as the glass cloth.

(Drying Step)

In the drying step, the applied layer is dried. Moreover, the fluororesin is melted to form a layer including the fluororesin and the inorganic filler or a layer including the fluororesin. In the layer including the fluororesin and the inorganic filler, a ratio of the inorganic filler/the fluororesin is small at the upper portion of the layer.

The drying step is performed by, for example, performing heating at more than or equal to 300° C. and less than or equal to 350° C. under a normal pressure or reduced pressure so as to remove the dispersion medium and melt the fluororesin.

(Layering Step)

In the layering step, the copper foil is layered on the upper surface of the applied layer.

Examples of a layering method include a method for placing the copper foil on the upper surface of the applied layer after the drying step and performing heat press; and the like.

In the layering step, two applied layers after the drying step are arranged such that respective substrate sides thereof face each other, the copper foils are placed on the upper surface and lower surface of the resulting layered body, and heat press is performed, thereby manufacturing substrate 1A for a high-frequency printed wiring board as shown in FIG. 2.

[Advantage]

The substrate for a high-frequency printed wiring board allows for an improved adhesive strength between the dielectric layer and the copper foil, and allows for an excellent high-frequency characteristic of a printed wiring board, whereby the substrate for a high-frequency printed wiring board can be used suitably as a substrate member of a high-frequency device.

Other Embodiment

The embodiments disclosed herein are illustrative and non-restrictive in any respect. The scope of the present invention is defined by the terms of the claims, rather than the configurations of the embodiments and manufacturing method embodiments described above, and is intended to include any modifications within the scope and meaning equivalent to the terms of the claims.

In other words, in each of the fifth and sixth embodiments, it has been described that the substrate for a high-frequency printed wiring board includes reinforcement layer 4 layered on insulation layer 2; however, this reinforcement layer 4 may be provided at a location other than insulation layer 2, and may be provided in insulation layer 2, for example. Moreover, the substrate for a high-frequency printed wiring board may include another layer such as a flexible layer in addition to reinforcement layer 4.

Examples

While the present invention will be described in more detail with reference to Examples, the present invention is not limited to these Examples.

[Manufacturing of Substrate for High-Frequency Printed Wiring Board]

(Materials Used)

The following describes materials used to prepare: the composition (I) containing the fluororesin, the inorganic filler and the dispersion medium; and the composition (II) containing the fluororesin and the dispersion medium.

Fluororesin: FEP ("NC-1500" provided by Daikin Industries)

Inorganic filler: silica filler ("FB3SDC" provided by Denka)

Dispersion medium: dipropylene glycol (provided by Tokyo Kasei Kogyo)

Glass cloth: "IC cloth #1015" provided by Unitika

Copper foil: electrolytic copper foil (Rz: 0.6 μm; average thickness: 18 μm)

(Preparation of Composition (I))

140 parts by mass of the silica filler was added to 100 parts by mass of the FEP, and 160 parts by mass of the dipropylene glycol was further added to obtain slurry, thereby preparing the composition (I).

(Composition (II))

"Dispersion ND110" provided by Daikin Industries was used.

(Manufacturing of Substrate for High-Frequency Printed Wiring Board)

A substrate for a high-frequency printed wiring board as shown in No. 1 of Table 1 was manufactured as follows. First, the composition (I) was applied onto a glass cloth and was dried, thereby forming a dielectric layer having an average thickness of 50 μm. Next, two bodies in each of which a copper foil was placed on the upper side of the dielectric layer were prepared, were arranged such that respective surfaces thereof at the glass cloth sides faced each other, and were then subjected to heat press, thereby manufacturing the substrate (No. 1) for a high-frequency printed wiring board.

A substrate for a high-frequency printed wiring board as shown in No. 2 of Table 1 was manufactured as follows. First, the composition (I) was applied onto a copper foil, a glass cloth was placed on the upper surface of the formed applied layer, and the applied layer was then reversed to be upside down and was dried, thereby producing a layered body including a dielectric layer having an average thickness of 50 μm and the copper foil. Next, two such layered bodies were produced, were arranged such that respective surfaces thereof at the glass cloth sides faced each other, and were then subjected to heat press, thereby manufacturing the substrate (No. 2) for a high-frequency printed wiring board.

A substrate for a high-frequency printed wiring board as shown in No. 3 of Table 1 was manufactured as follows. First, the composition (II) was applied onto a copper foil and was dried, thereby forming a fluororesin layer having an average thickness of 3 μm. Next, the composition (I) was applied onto the upper surface of the fluororesin layer and was dried to form a dielectric layer (dielectric layer 2 in FIG. 4) having an average thickness of 50 μm, and a glass cloth was then placed on the upper surface of the composition (I) layer, thereby producing a layered body. Two such layered bodies were produced, were arranged such that respective surfaces thereof at the glass cloth sides faced each other, and were then subjected to heat press, thereby manufacturing the substrate (No. 3) for a high-frequency printed wiring board.

A substrate for a high-frequency printed wiring board as shown in No. 4 of Table 1 was manufactured as follows. First, the composition (I) was applied onto a copper foil and was dried, thereby forming a layered body including a dielectric layer having an average thickness of 50 μm and the copper foil. Two such layered bodies were produced, were arranged such that the dielectric layers thereof faced each other with glass cloths interposed therebetween, and were then subjected to heat press, thereby manufacturing the substrate (No. 4) for a high-frequency printed wiring board.

[Evaluation]

For each of substrates No. 1 to No. 4 for high-frequency printed wiring boards, below-described methods were employed to measure: atomic ratio A (the number of inorganic atoms/the number of fluorine atoms) in the superficial region; the ratio of the total cross sectional area of the inorganic filler in each of the region at a distance of more than or equal to 0 μm and less than or equal to 2 μm from the copper foil and the region at a distance of more than or equal to 18 μm and less than or equal to 22 μm from the copper foil; and the adhesive strength (180° peel strength).

(Atomic Ratio (A))

From each of the manufactured substrates for high-frequency printed wiring boards, the copper foil was removed. EDX ("FlatQUAD XFlash 5060F" provided by Bruker) was used to quantify the inorganic atoms (silicon atoms) and the fluorine atoms at an acceleration voltage of 5 keV in the exposed surface. From the measured value, the atomic ratio of the inorganic atoms/the fluorine atoms was calculated.

(Multiple Value (C))

For each of the manufactured substrates for high-frequency printed wiring boards, a cross section polisher was used to obtain a precise polished cross section of dielectric layer 2 in the direction perpendicular to copper foil 3. An image of this cross section was obtained using a scanning electron microscope (SEM).

For the region (2a) and the region (2c) in the above-described SEM image, a binarization process was performed to determine respective values (%) (the area ratio (B-1) and the area ratio (B-2)) of the ratios (B) of the total cross sectional areas of the inorganic filler to the overall cross sectional areas in the regions.

From the determined values of the area ratio (B-1) and the area ratio (B-2), the multiple value (C) was calculated.

(Adhesive Strength)

Each of the manufactured substrates for high-frequency printed wiring boards was cut to have a length of 10 cm and a width of 10 cm, thereby producing a test piece for adhesive strength evaluation. 180° peel strength was measured using a tension test device with a detachment rate being set to 50 mm/minute. An adhesive strength of more than or equal to 9 (N/cm) is required.

From the result of Table 1, in each of substrates No. 1 to No. 3 for high-frequency printed wiring boards, the adhesive strength was improved because the atomic ratio (A) and the multiple value (C) fall within the above-described ranges. On the other hand, in substrate No. 4 for a high-frequency printed wiring board, the respective values fell out of the above-described ranges, thus resulting in an insufficient adhesive strength.

REFERENCE SIGNS LIST

1, 1', 1A, 1A', 1B, 1B': substrate for a high-frequency printed wiring board; 2: dielectric layer; 2A: layer 2A, 2B: layer 2B; 2a: region 2a (at a distance of more than or equal to 0 μm and less than or equal to 2 μm from a copper foil); 2b: region 2b (at a distance of more than 2 μm and less than 18 μm from the copper foil); 2c: region 2c (at a distance of more than or equal to 18 μm and less than or equal to 22 μm from the copper foil); 2d: region 2d (at a distance of more than 22 μm from the copper foil); 3: copper foil.

The invention claimed is:

1. A substrate for a high-frequency printed wiring board, the substrate comprising:

a dielectric layer including a fluororesin and an inorganic filler; and a copper foil layered on at least one surface of the dielectric layer, wherein a surface of the copper foil at the dielectric layer side has a maximum height roughness (Rz) of less than or equal to 2 μm, a ratio of the number of inorganic atoms of the inorganic filler to the number of fluorine atoms of the fluororesin in a superficial region of the dielectric layer at the copper foil side is less than or equal to 0.08, and a softening temperature of the fluororesin is more than or equal to 250° C. and less than or equal to 310° C.

2. The substrate for a high-frequency printed wiring board according to claim 1, wherein the fluororesin is a tetrafluoroethylene-hexafluoropropylene copolymer, a tetrafluoroethylene-perfluoroalkyl vinyl ether copolymer, polytetrafluoroethylene, or a combination of the tetrafluoroethylene-hexafluoropropylene copolymer, the tetrafluoroethylene-perfluoroalkyl vinyl ether copolymer, and the polytetrafluoroethylene.

3. The substrate for a high-frequency printed wiring board according to claim 2, wherein the fluororesin is the tetrafluoroethylene-hexafluoropropylene copolymer.

4. The substrate for a high-frequency printed wiring board according to claim 1, wherein a mass ratio of the inorganic filler to the fluororesin in the dielectric layer is more than or equal to 1.0.

5. The substrate for a high-frequency printed wiring board according to claim 1, wherein the inorganic filler includes silica.

TABLE 1

| Substrates for High-Frequency Printed Wiring Boards | | No. 1 | No. 2 | No. 3 | No. 4 |
|---|---|---|---|---|---|
| Atomic Ratio (A) (the Number of Inorganic Atoms/the Number of Fluorine Atoms) | Superficial Region | 0.018 | 0.067 | 0.000 | 0.102 |
| Multiple Value (C) (Area Ratio (B-1)/Area Ratio (B-2)) | Area Ratio (B-1) (Region 2a (0 to 2 μm)) (%) | 20.0 | 44.4 | 0.0 | 67.4 |
| | Area Ratio (B-2) (Region 2c (18 to 22 μm)) (%) | 66.2 | 65.5 | 66.0 | 59.3 |
| | Multiple Value (C) | 0.3 | 0.7 | 0.0 | 1.1 |
| 180° Peel Strength (N/cm) | | 13 | 10 | 13 | 8 |

6. The substrate for a high-frequency printed wiring board according to claim 1, wherein a linear expansion coefficient of the substrate in a thickness direction is less than or equal to 50 ppm/K.

7. The substrate for a high-frequency printed wiring board according to claim 1, wherein a change of permittivity of the substrate by a temperature in a range of 25° C. to 120° C. is less than or equal to 2%.

8. A substrate for a high-frequency printed wiring board, the substrate comprising:

a dielectric layer including a fluororesin and an inorganic filler; and a copper foil layered on at least one surface of the dielectric layer, wherein a surface of the copper foil at the dielectric layer side has a maximum height roughness (Rz) of less than or equal to 2 μm, and in a cross section of the dielectric layer in a direction perpendicular to the copper foil, a ratio of a total cross sectional area of the inorganic filler to an overall cross sectional area in a region at a distance of more than or equal to [18] *0* μm and less than or equal to [22] *2*μm from the copper foil is 0.7 time or less as large as a ratio of a total cross sectional area of the inorganic filler to an overall cross sectional area in a region at a distance of more than or equal to [0] *18* μm and less than or equal to [2] *22* μm from the copper foil.

* * * * *